United States Patent [19]

Mukherjee et al.

[11] Patent Number: 4,698,787
[45] Date of Patent: Oct. 6, 1987

[54] SINGLE TRANSISTOR ELECTRICALLY PROGRAMMABLE MEMORY DEVICE AND METHOD

[75] Inventors: Satyen Mukherjee, San Jose; Thomas Chang, Santa Clara, both of Calif.

[73] Assignee: Exel Microelectronics, Inc., San Jose, Calif.

[21] Appl. No.: 673,946

[22] Filed: Nov. 21, 1984

[51] Int. Cl.$^4$ ............................................. G11C 11/34
[52] U.S. Cl. ..................................... 365/185; 365/104; 357/23.5
[58] Field of Search ............... 365/182, 185, 218, 104; 357/23.5

[56] References Cited

U.S. PATENT DOCUMENTS

| | | | |
|---|---|---|---|
| 3,744,036 | 7/1973 | Frohman-Bentchkowsky | ... 365/185 |
| 4,136,292 | 1/1979 | Suzuki et al. | .................... 365/208 X |
| 4,180,826 | 12/1979 | Shappir | ........................... 365/104 X |
| 4,366,555 | 12/1982 | Hu | ......................................... 365/185 |
| 4,376,947 | 3/1983 | Chiu et al. | ....................... 365/185 X |

OTHER PUBLICATIONS

M. Van Buskirk et al., "E-PROMs Graduate to 256-K Density with Scaled N-Channel Process", Electronics, Feb. 24, 1983, pp. 2–7 to 2–11.
W. S. Johnson et al., "16-K EE-PROM Relies on Tunneling for Byte-Erasable Program Storage", Electronics, Feb. 28, 1980, pp. 2–10 to 2–14.
William S. Johnson et al., "A 16Kb Electrically Erasable Nonvolatile Memory", 1980 Institute of Electrical and Electronic Engineers, AR-118.
Don Knowlton, "Versatile Algorithm, Equipment Cut EPROM Programming Time", Intel, EDN Mar. 17, 1983, pp. 2–13 to 2–16.
S. Roberts et al., "Selective Studies of Crystalline Reactively Sputtered $Ta_2O_5$ Films", 166th Electrochemical Society Meeting, Oct. 1984, pp. 491–492.
S. Seki et al., "P-Channel TFT's Using Magnetron-Sputtered $Ta_2O_5$ Films as Gate Insulators", IEEE Electron Device Letters, vol. EDL-5, No. 6, Jun. 1984, pp. 197–198.

Primary Examiner—Joseph A. Popek
Attorney, Agent, or Firm—Limbach, Limbach & Sutton

[57] ABSTRACT

An electrically erasable programmable memory device which is programmable in the manner of an EPROM and erasable in the manner of an EEPROM. A dielectric layer between the control gate and the floating gate is provided having a high dielectric constant. A thin, uniform gate dielectric layer is provided which demonstrates minimal trapping. Finally, an asymmetrical source/drain junction is provided wherein the source includes a shallow portion and a deeper portion, which deeper portion defines the overlap between the source and the floating gate. In the preferred embodiment the dielectric between the control gate and the floating gate comprises tantalum pentoxide, the thin dielectric layer comprises oxynitride, and the deep diffusion portion of the source comprises phosphorous.

17 Claims, 12 Drawing Figures

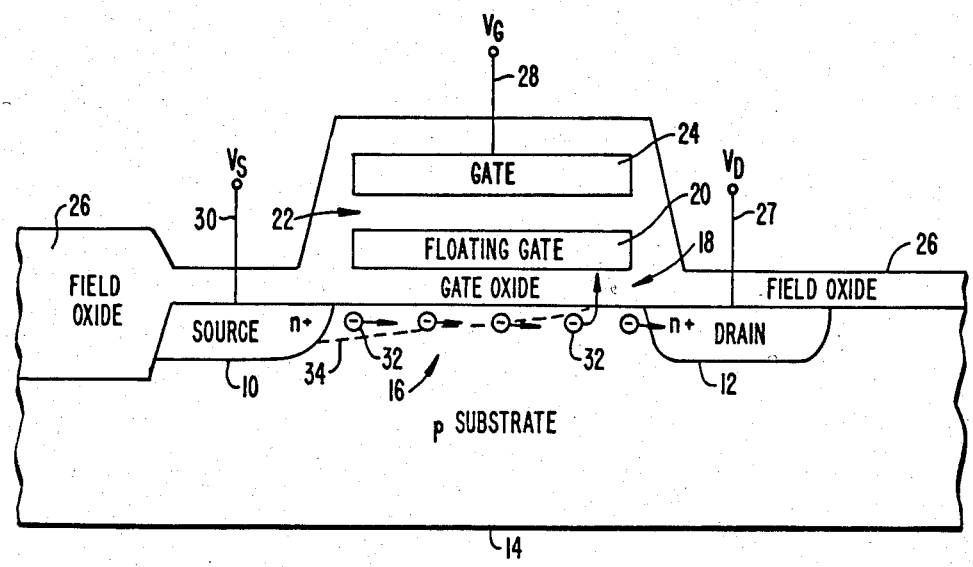
FIG._1. (PRIOR ART)
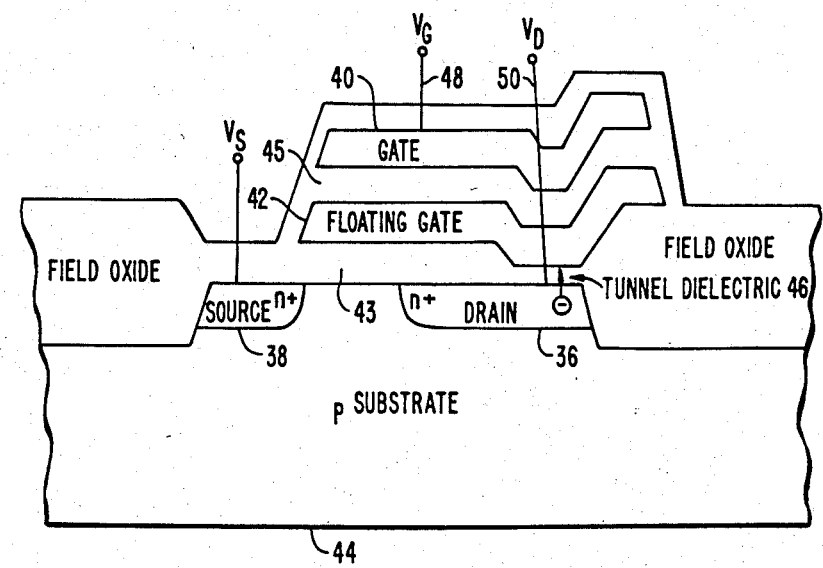
FIG._2. (PRIOR ART)

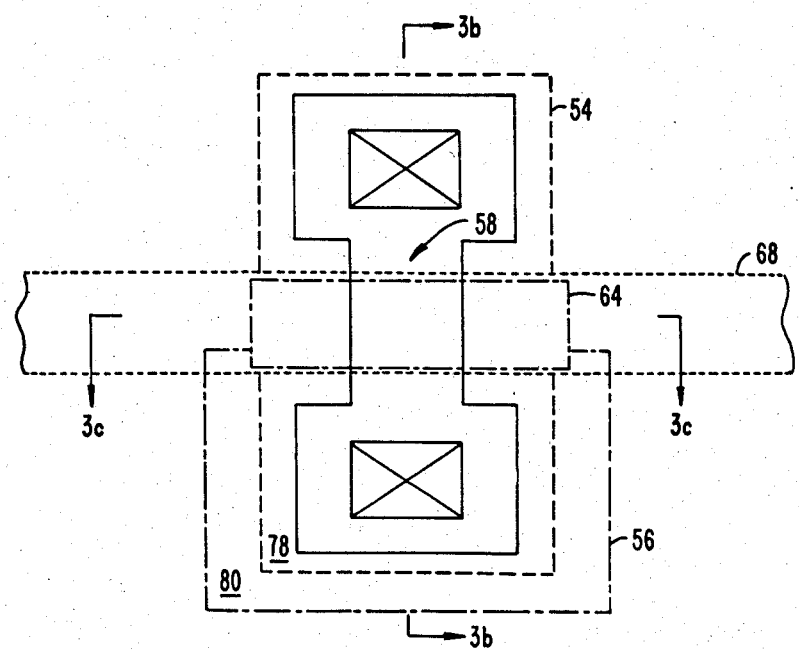
FIG._3a.
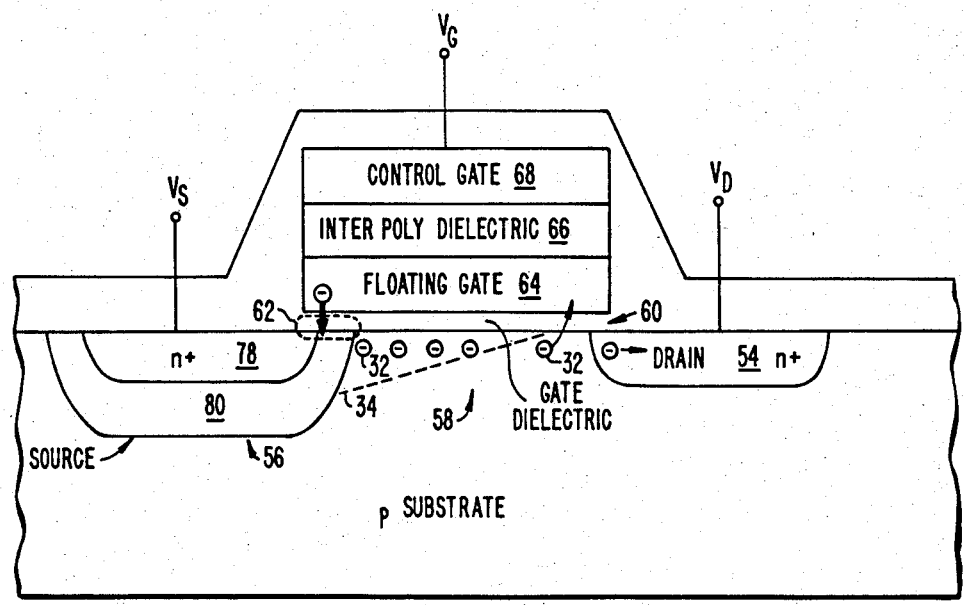
FIG._3b.

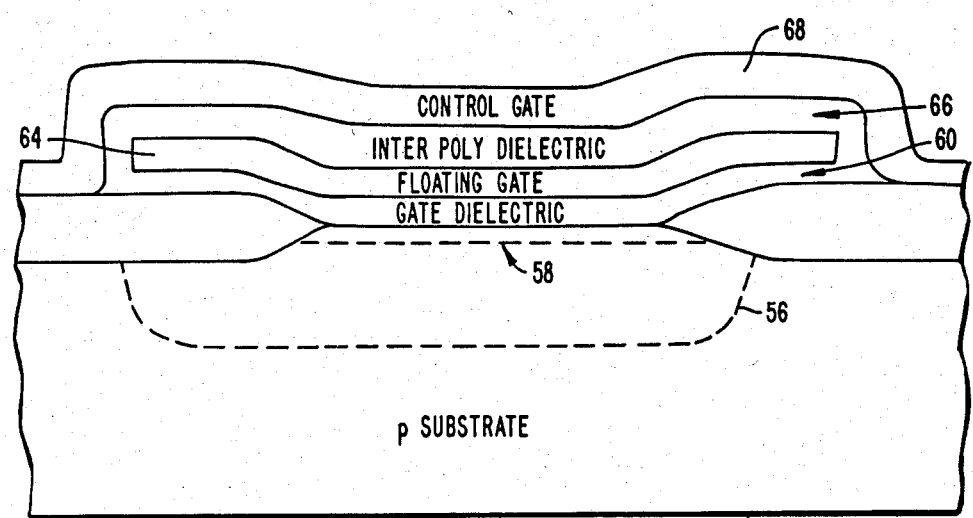
FIG._3c.
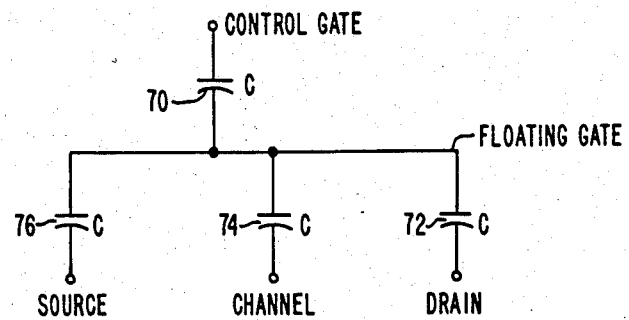
FIG._4.

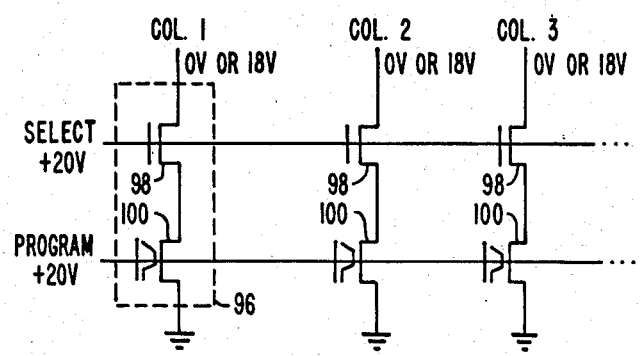
FIG._5a. (PRIOR ART)
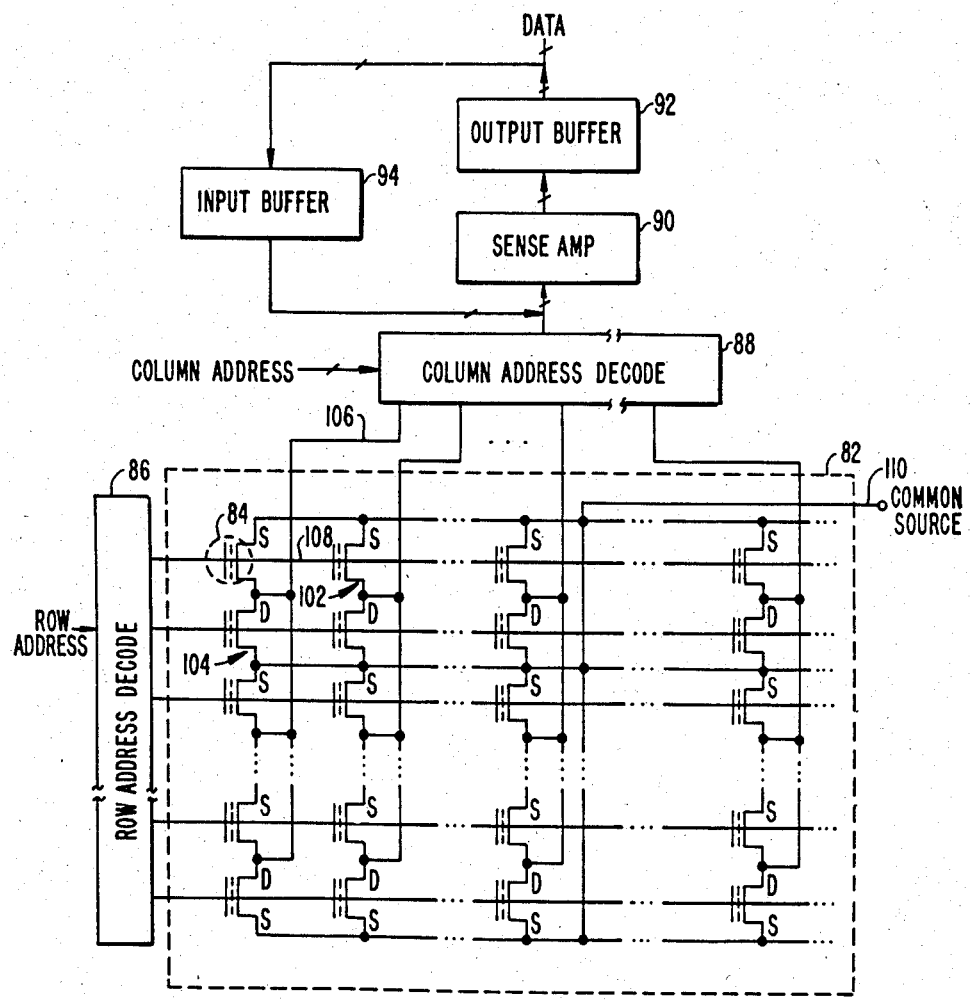
FIG._5b.

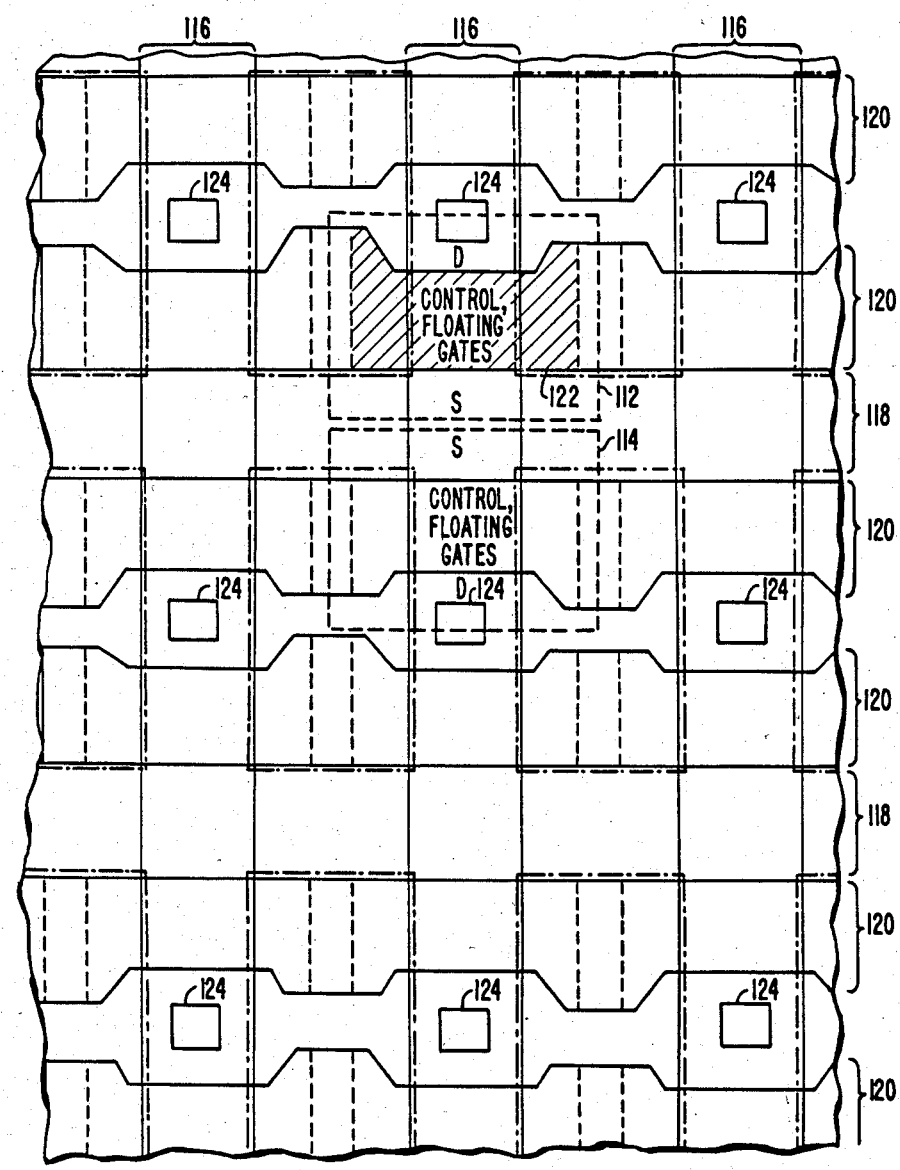
FIG._5c.

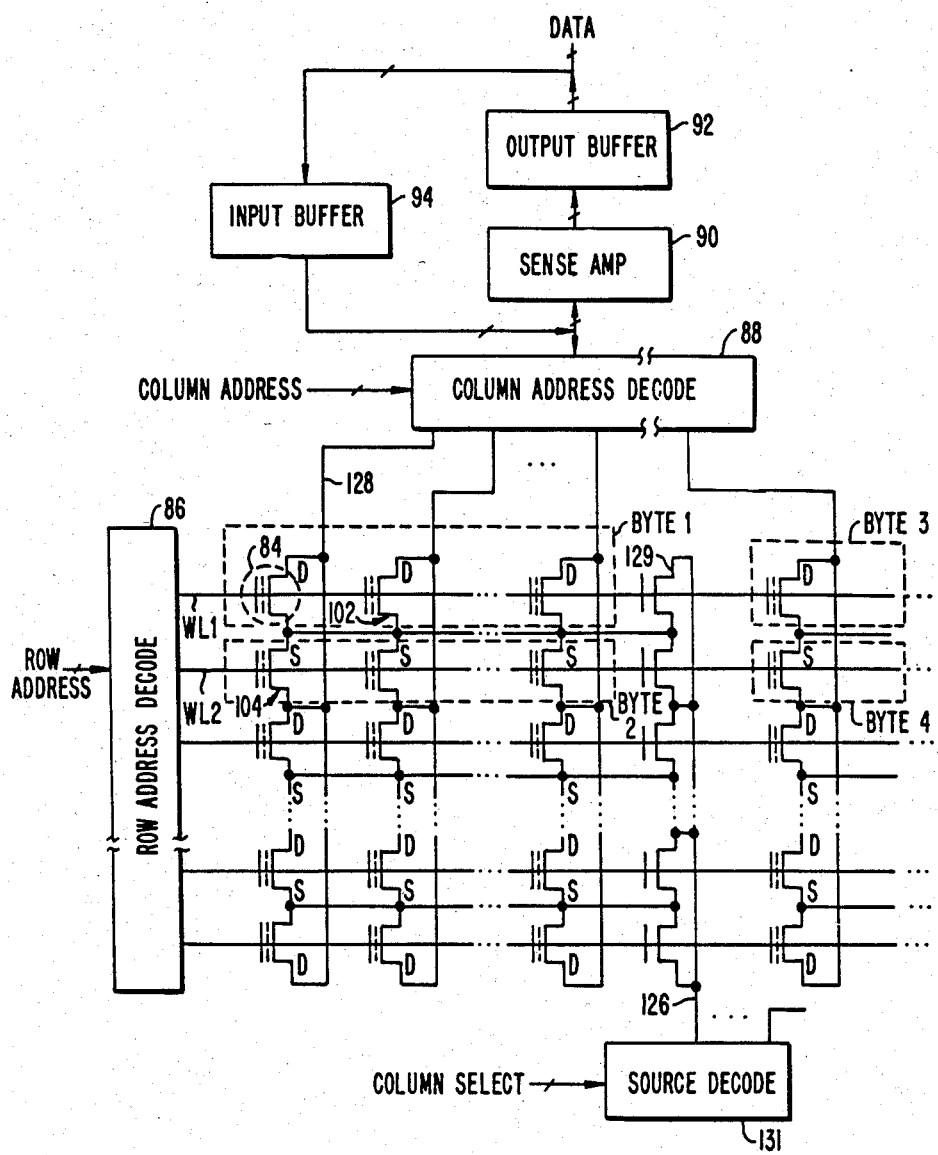
FIG._5d.

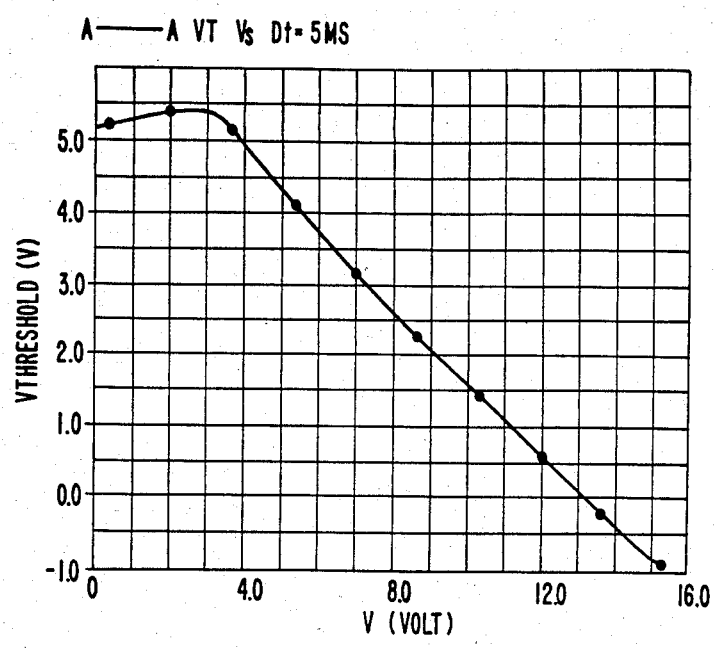
FIG._6a.
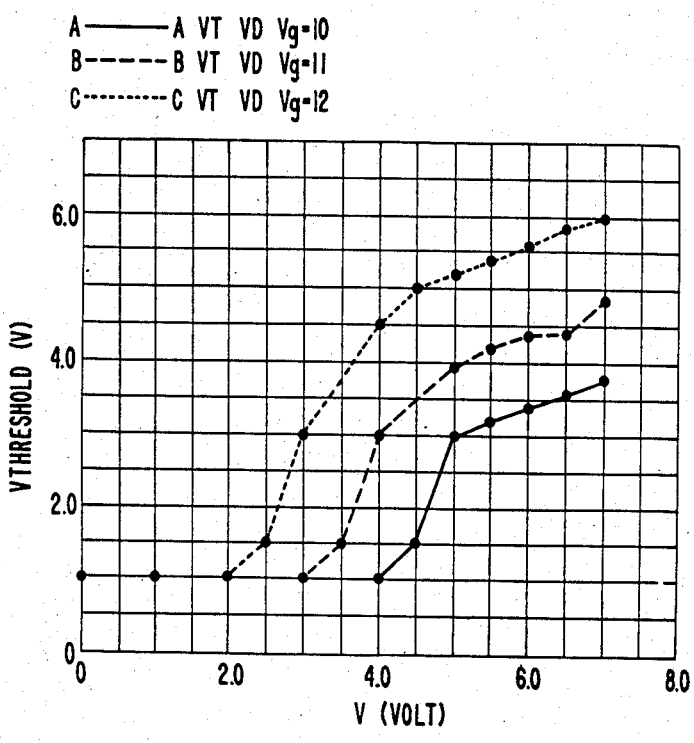
FIG._6b.

SINGLE TRANSISTOR ELECTRICALLY PROGRAMMABLE MEMORY DEVICE AND METHOD

BACKGROUND ART

The present invention is directed to an electrically programmable and erasable device and a method for making the same. The electrically programmable memory device can be of the type that is commonly called Electrically Erasable Programmable Read Only Memory (EEPROM). More particularly, the present invention relates to the structure and manufacture of a single transistor EEPROM cell suitable for use in high density memory devices EEPROM devices and methods for making such devices are well known in the art. In general, an EPROM or an EEPROM is characterized by a "floating gate" and an electrical connection termed a "control gate", both of which are fabricated out of polycrystalline silicon doped with an appropriate doping material to render the polycrystalline conductive. A typical doping material is phosphorus.

The floating gate is separated from a substrate region by a gate oxide layer of insulating material The substrate region includes symmetrical source and drain regions which define a channel The floating gate and the control gate are separated by a layer of insulating material, typically silicon dioxide ($SiO_2$). The principle upon which the EPROM or EEPROM device operates is that electrons, or charge are stored on the "floating gate" in a capacitive manner. Thus the dielectric layer between the floating gate and the control gate is important.

In the prior art (see for example, U.S. Pat. No. 4,203,158 and W. S. Johnson et al. ISCCC Digest of Technical Papers, pp. 152-153 (Feb., 1980)), the floating gate is formed by reacting $SiH_4$ in a low pressure chemical vapor deposition chamber and then doped with $POCl_3$ in a separate doping cycle.

A layer of silicon dioxide is then deposited or thermally grown on the doped polycrystalline layer of silicon. The layer of silicon dioxide is typically approximately 750 angstroms. Generally, a high oxidation temperature (greater than 1050 degrees C.) and heavier phosphorus doping are required to achieve better interpoly quality and breakdown capability. However, oxidation at high temperature on heavily-doped polysilicon involves several drawbacks, such as: (1) outgassing during interpoly oxidation which causes autodoping on the wafer; and (2) oxidation enhanced diffusion of phosphorus from the floating gate to the tunnel oxide, which forms trapping centers in the oxide. The electron trapping collapses the threshold window EEPROM cell at $10^4$ cycles. (See: R. B. Marcus et al.,*J. Electrochem. Soc.*, p. 1282, June, 1982; K. Saraswat et al.,*Computer-Aided Design of Integrated Circuit Fabrication Process for VLSI Device*, p. 244-290, July, 1981.) Thus, current devices exhibit low cyclability for program and erase operations.

Finally, the second layer of doped polycrystalline silicon is formed on top of the insulating layer of $SiO_2$.

Because the insulating layer of silicon dioxide is on the order of 750 angstroms, the typical write or erase voltage, i.e., the voltage which is needed to place charge on or to remove charge from the floating gate, has been high, i.e., in excess of 20 volts. In turn, this places shrinkage limits on gate oxide thickness, junction depth and die size.

Silicon nitride ($Si_3N_4$) has also been used as an insulating layer of dual dielectric (thermal oxide with silicon nitride on it) between the floating gate and the control gate connection. Silicon nitride has the property that it is more dense than silicon dioxide and, therefore, affords higher capacitive coupling between the floating gate and the control gate. A typical dual dielectric between the floating gate and the control gate is composed of 500 angstroms oxide and 400 angstroms nitride. However, even with the use of silicon nitride as the insulting layer, the write and erase voltage is still relatively high, in excess of 18 volts. High erase and program voltages for conventional EEPROM devices are of major concern. Such a requirement has led to the need for a separate high voltage supply when operating the devices, or for the use of special voltage multiplying circuitry within the device for boosting the supply voltage to the requisite program and erase levels.

An additional drawback is that current EEPROM structures, when used in a memory array, require additional control circuitry to isolate individual storage cells from one another. This increases the device geometry. For example, given the requirement of a control transistor for each EEPROM cell, the equivalent space requirement for a conventional EEPROM cell is 165 square microns.

DISCLOSURE OF INVENTION

These and other problems of previous EEPROM devices are overcome by the present invention of an electrically erasable programmable memory device comprising a body of single crystalline semiconductive material having a source and a drain, a first layer of insulating material positioned on the body, a floating gate positioned on the first layer of insulating material, a second layer of insulating material positioned on the floating gate, and a gate over the second layer of insulating material, wherein the source is formed of a deep region of a first material, such as phosphorous and a shallower region of a second material, such as arsenic and phosphorous, and the drain is formed of a shallow region of the second material, and further wherein a portion of a part of the deep region, such as arsenic only, underlies the first layer of insulating material and the first material is selected to optimize the junction overlap with the gate, in order to control capacitive coupling between the floating gate and the source.

In another aspect of the present invention, the first layer of insulating material is thinner with respect to the second layer, and the first layer of insulating material is substantially free from traps.

In another feature of the present invention the second layer of insulating material is chosen to have a high dielectric constant. Such a requirement can be satisfied by a sandwich of oxide-rich tantalum pentoxide and thermal oxide.

With the above described structure an EEPROM cell is provided which is progammable as if it were an EPROM and erasable like an EEPROM. In order to program the device, the drain and gate of the device are raised to predetermined potentials above the potential of this source. To discharge or erase the cell the drain is floated and the source is raised to a potential above that of the gate.

Because of the above discussed programming and erasing characteristics of the device of the present invention, a memory cell can be formed of a single such device without the need for a select transistor. Further, because of the selection of the first and second layers of insulating material and the asymmetrical shape of the source/drain region, a significantly smaller cell size can be provided along with a lower programming voltage requirement.

Further, it has been found that growing a layer of tantalum pentoxide on a thermal oxide layer by reactive sputtering, and by using argon and oxygen as the sputtering gas, provides a high quality tantalum pentoxide layer for the second layer of insulating material.

Further it has been found that by growing oxynitride as the first layer of insulating material at 850 degrees C. in dry oxygen, and then annealing the material at 1050 degrees C. in an ammonia/argon ambient, a layer which is substantially free of traps is provided.

Additionally, it has been found that by in situ doping the floating gate one can obtain an exceptionally smooth surface upon which to grow the second layer of insulating material.

It is therefore an object of the present invention to provide an EEPROM transistor which itself can be used as a complete memory cell.

It is another object of the present invention to provide a memory device which is programmable in the manner of an EPROM device and erasable in the manner of an EEPROM device.

It is a further object of the present invention to provide an EEPROM transistor having a small surface area.

It is still another object of the present invention to provide an EEPROM cell which requires substantially lower programming and erasing voltages as compared to that of the prior art.

These and other objectives, features and advantages of the present invention will be more readily understood upon consideration of the following detailed description of the preferred embodiment of the present invention and the accompanying drawings.

BRIEF DESCRIPTION OF THE DRAWING

FIG. 1 is a cross section of a conventional EPROM device.

FIG. 2 ls an illustration of a conventional EEPROM device.

FIG. 3a is a top view of the present invention.

FIG. 3b is a cross sectional view of the present invention taken along lines 3b—3b of FIG. 3a.

FIG. 3c is a cross sectional view of the present invention taken along line 3c—3c of FIG. 3a.

FIG. 4 illustrates the equivalent capacitive circuit of the device of the present invention.

FIG. 5a is a simplified schematic diagram of conventional EEPROM cells connected in a memory array.

FIG. 5b is a simplified schematic of EEPROM transistors of the present invention connected in a memory array with a block erase feature.

FIG. 5c is a top view of the geometry of an array of memory cells constructed according to the present invention.

FIG. 5d is a simplified schematic of EEPROM transistors of the present invention connected in a memory array with a byte erase feature.

FIG. 6a illustrates the erasing conditions and characteristics of the device of the present invention.

FIG. 6b illustrates a typical programming characteristics and conditions of a device constructed in accordance with the present invention.

BEST MODE FOR CARRYING OUT THE INVENTION

Referring now to FIG. 1 a cross section of a typical EPROM transistor device is shown. A source 10 and a drain 12 are formed on a substrate 14. The source 10 and drain 12 define a channel 16 in the substrate 14. Positioned above the channel 16 is a layer of insulating material which forms a gate dielectric layer 18. A floating gate 20 of semiconductive material is formed over the gate dielectric layer 18. A second layer 22 of insulating material 22 is formed over the floating gate 20. Finally, a layer of semiconductive material is formed over the second layer of insulating material 22 to form a control gate 24. A field oxide 26 isolates the transistor structure from periphery devices Electrical connections 26, 28, and 30 are provided for applying voltages to the drain 12, gate 24, and source 10, respectively.

Programming of the typical EPROM cell is accomplished by raising the potential of the drain 12 to between 8 and 12 volts, holding the source 10 at ground potential, and applying a pulse of approximately 13 to 21 volts amplitude to the control gate 24, and having a period of approximately 1 to 10 milliseconds.

The result of these conditions is that a conductive region is established in the channel 16 across which electrons 32 are accelerated. This conductive region is designated by the dashed line 34 of FIG. 1. The magnitude and polarity of the voltages applied to the drain 12, source 10 and gate 24 are such that this conductive region 34 is "pinched off" in a region adjacent to drain 12. This causes the electrons 32 to be raised sufficiently in potential so that they become "hot", these hot electrons create additional electronhole pairs by impact ionization. In this condition these electrons are elevated to an energy level which permits them to overcome the insulating property of gate dielectric 18. The hot electrons can thus "jump" the potential barrier of the gate dielectric 18. Thereafter, due to the electric field created by the control gate 24, they are attracted to floating gate 20 where they are stored.

The significant disadvantage of the EPROM structure is the requirement that the EPROM be erased by exposure to ultraviolet light. When the EPROM cells are in an array, effectively all such cells are erased together. Thus, when changes are sought to be made to a program stored in the array, even when the changes are minor, the entire array must be erased and the entire program rewritten into the array.

Referring to FIG. 2, there is shown an EEPROM structure. This structure utilizes a different mechanism for programming and erasing as compared to the EPROM structure. As with the EPROM structure, the EEPROM structure has a drain 36, a source 38, a floating gate 32 separated from the substrate by a gate oxide layer 43, a gate 40 separated from the floating gate 32 by another oxide layer 45, all of which are deposited or thermally grown. However, the EEPROM structure differs from the EPROM structure in that it provides a thin tunnel dielectric 46 between the drain 36 and the floating gate 42. As can be seen from FIG. 2, the portion of the floating gate 42 which is positioned above the tunnel dielectric 46 is positioned on the drain 36. Further, the portion of gate 40 which is aligned with the tunnel dielectric 46 is also positioned on the drain 36. Programming and erasing of this structure is achieved by inducing potential differences between the gate and drain lines, 48 and 50, respectively, which are on the order of 20 volts. The thin dielectric region coupled with the high voltage between gate and drain permits a phenomenon called "Fowler-Nordheim tunneling". To program, i.e. to place electrons on the floating gate, the drain is held at a ground potential while the gate is pulsed for approximately 10 milliseconds at a potential of approximately 20 volts. To erase, i.e. to remove electrons from the floating gate 42, the gate is held at a ground potential while the drain 36 is pulsed for approximately 10 milliseconds at a potential of approximately 20 volts. During the erase and program operations, the source 38 is permitted to float. Under these conditions electrons can tunnel through the tunnel dielectric 46 to or from floating gate 42.

With the above EEPROM structure an individual EEPROM cell can be selectively programmed or erased. Typically, all cells in an array are programmed to the same logic value, and thereafter individual cells are selectively erased, in order to place the final logical values in the array. However, as discussed earlier, among the disadvantages of the typical EEPROM structure are: (1) the requirement of a high voltage to program or erase the cell, and (2) the requirement of a select transistor for each EEPROM cell for isolating each cell when the EEPROM cells are used in an array.

Referring now to FIGS. 3a, 3b and 3c, the structure of the present invention will now be described. The structure of the present invention features an asymmetrical drain/source junction, a uniformly thin gate dielectric, and a dielectric between the control gate and the floating gate which has a high dielectric constant. As a result of these features, an EEPROM device is obtained which is programmed in a manner similar to an EPROM, and is erased in a manner similar to an EEPROM, but at a lower voltage, all with same physical size as an EPROM, and without requirement for select transistors when used in an array.

FIG. 3b illustrates a cross sectional view of the preferred embodiment of the present invention. A substrate 52 has formed in it a relatively shallow drain region 54, and a deeper source region 56. A channel 58 is defined between the source 56 and drain 54. A gate dielectric 60 is formed over the channel 58 and to extend between drain 54 and to overlap a portion 62 of source 56. It is to be noted that this layer has a relatively uniform thickness over the entire cross section.

A floating gate 64 is formed over the gate dielectric 60. A second layer of dielectric material 66 is formed over the floating gate 64. Finally a control gate 68 is formed over the second layer of insulating material 66.

FIG. 3a shows a top view of the physical positioning of the various component parts of the present invention. As can be seen from the figure the control gate 68 and floating gate 64 are positioned above one another and the channel 58. The source diffusion 56 extends under the floating gate 64.

FIG. 3c is a cross sectional view of the present invention taken along lines 3c—3c of FIG. 3a. As can be seen from FIGS. 3b and 3c, the structure of the present invention is noticeably more symmetrical than that of the typical EEPROM, yet more asymmetrical than than of the typical EPROM structures. More specifically, the device of the present invention lacks the pronounced "dip" in the gate dielectric, floating gate, intergate dielectric, and control gate associated with the tunneling dielectric of conventional EEPROMs. Further, the asymmetrical source/drain configuration of the present invention is noticeably different from the symmetrical source/drain junctions of conventional EPROMs.

In operation, programming of the EEPROM cell of the present invention is achieved by raising the drain 54 and control gate 68 to predetermined potentials above that of the source 56. In the preferred embodiment of the present invention the drain 54 is raised to between 4 and 6 volts, while the gate is pulsed at an amplitude of approximately 10 to 12 volts for approximately 0.5 to 5 msec. Under these conditions "hot" electrons are generated and accelerated across the gate dielectric 60 and onto the floating gate 64. In the preferred embodiment of the present invention, this results in an increase of the floating gate threshold by approximately 3.5 to 5.5 volts. Thus, the programming operation in the present invention is similar to that of a typical EPROM.

On the other hand, erasing of the EEPROM cell of the present invention is achieved by floating the drain node 54, holding the control gate 68 at ground potential, and applying a pulse of high voltage to the source 56. In the preferred embodiment of the present invention this pulse has an amplitude between 10 and 13 volts and a duration of between 0.5 and 5 msec. Under these conditions, Fowler-Nordheim tunneling occurs between the floating gate 64 and the portion 62 of the source diffusion 56 which underlies the floating gate 64. The erasing operation causes the threshold voltage of the cell to be reduced to a level on the order of one volt.

The above mix of programming and erase mechanisms, in part, alleviate the requirement of a separate select transistor for each memory cell in an array of memory cells of the present invention.

The logical condition of the cell is determined in a manner similar to that in connection with an EPROM cell. The source 56 is held at a ground potential, the gate is held at a potential between three to five volts, and the drain is held at a potential between one to two volts. Under these conditions, an erased cell will conduct at a current level of between 25 to 50 microamps. On the other hand, a programmed cell will not conduct.

From the above it is to be appreciated that the improved performance of the present invention has been achieved not only by employing an EPROM programming mechanism, and an EEPROM erase mechanism, but also by providing an asymmetric source/drain junction, a thin gate dielectric 60 having superior trapping characteristics, and a dielectric layer between the control gate 68 and floating gate 64 which has a high dielectric constant. It is to be understood that while each of the features, in and of themselves, contribute to improve to the performance of the present invention, the combination of these features results in an even greater improvement over previous EEPROM structures.

Referring to FIG. 4, an equivalent circuit is illustrated which describes the capacitive coupling between the control gate, floating gate, source, channel, and drain. This capacitive coupling plays a substantial role in determining the amount of charge which is caused to be stored, or drawn from, the floating gate 64 during a program, or erase, operation. The capacitive coupling between the control gate 68 and the floating gate 64 is shown represented by capacitor 70. The capacitive coupling between the floating gate 64 and drain 54 is represented by capacitor 72. The capacitive coupling between the floating gate 64 and channel 58 is represented by capacitor 74. Finally, the capacitive coupling between the floating gate 64 and the source 56 is represented by capacitor 76.

It can be shown that the voltage, $V_{FG}$, across the floating gate 64 with respect to the substrate 52, is defined by the equation $V_{FG}=V_G(C_{70}/(C_{70}+C_{72}+C_{74}+C_{76}))$, where the voltage $V_g$ is applied to the control gate.

The higher the voltage across the floating gate 64, the larger the amount of electrons stored on the floating gate. In turn, the more electrons on the floating gate, the higher the threshold of the device.

The structure of the present invention maximizes the voltage across the floating gate in a number of ways. With respect to the dielectric 66, it has been found that by selecting a material having a high dielectric constant, i.e., greater than 5, the voltage coupled to the floating gate can be increased. In the preferred embodiment to the present invention tantalum pentoxide can be used. Tantalum pentoxide has a dielectric constant of approximately 21. Silicon nitride, which has a dielectric constant of 7, can also be used. This permits a high capacitance value with small physical size. The larger the value of capacitor 70, the smaller the impact of capacitors 72, 74 and 76 on the voltage across the floating gate 64. A typical cell size for the present invention is 5 microns by 5 microns and can be reduced further with improved lithography techniques.

It has been found that the retention characteristics of the tantalum pentoxide can be increased when the dielectric layer of 66 is formed of a sandwich of tantalum pentoxide and of thermal oxide. Preferably, the tantalum pentoxide layer is approximately 500 angstroms thick, while the thermal oxide layer is approximately 150 angstroms thick. Further, it has been found that a slightly oxide-rich tantalum pentoxide material yields improved data retention. The layer of thermal oxide has been found to permit the use of higher temperature cycles in the fabrication process than would normally be permissible when tantalum pentoxide is used alone. Further, the thermal oxide layer reduces the leakage current through tantalum pentoxide.

The selection of the gate dielectric 60 is another means by which the performance of the device is enhanced. As can be seen from FIG. 3b, the capacitance 76 in the FIG. 4 between the floating gate 64 and the source 56 is a function of the overlap area 62 between the gate dielectric 60 and the source 56, the gate dielectric constant, and the thickness of the gate dielectric. In the preferred embodiment of the present invention the gate dielectric 60 has a thickness in the 100 to 200 angstrom range. Preferably, the gate dielectric is formed from oxynitride, and the overlap region 62 is kept small, preferably 0.3 to 0.4 micrometers.

There are a number of factors which influence the selection of these parameters. One such factor is the cyclability of the cell between a programmed and erased condition. This cyclability is determined, in part, by the trapping characteristics of the gate dielectric 60 and the current density flowing through the gate dielectric 60. The higher the current density, the lower the cyclability. Oxynitride is the preferred material for the gate dielectric layer 60 in that, in accordance with the method of the present invention, it can be made relatively free from trapping effects. It has also been found that oxynitride is a good barrier with respect to phosphorous migration, thus, preserving the integrity of the floating gate 64.

Current density in the gate dielectric layer 60 is a function of the area and thickness dimensions of the layer 60. The capacitance between the floating gate 64 and the source 56 is proportional to the thickness of the gate dielectric layer 60, and the current density through the gate dielectric layer 60 varies inversely with the thickness. The value of capacitance 76 is proportional to the overlap portion 62 of source 56.

The thickness of the gate dielectric layer 60 and the overlap of portion 62 are thus chosen to optimize the current density through the layer 60 and to optimize the capacitive coupling between source 56 and floating gate 64. A further limitation to the thickness of the gate dielectric layer is that the Fowler-Nordheim tunneling effects require a thin dielectric layer. Thus, in the preferred embodiment of the present invention, the gate dielectric is preferably formed of oxynitride and has a thickness from between 100 and 200 angstroms. Further, the overlap region 62 of source 56 is approximately 0.3 to 0.4 microns. With the above structure, cyclability in the order of $10^6$ can be obtained.

As was discussed briefly above, the present invention also includes an asymmetrical source/drain junction. In the preferred embodiment of the present invention the source 56 is formed of a shallow diffusion region 78 and a deeper diffusion region 80. The deeper diffusion region 80 underlies the floating gate by approximately 0.2 microns, while the shallow diffusion region 78 underlies the floating gate by approximately 0.1 microns, to form the 0.3 to 0.4 micron overlap region 62. In the preferred embodiment of the present invention the drain diffusion 54 is formed from arsenic and underlies the floating gate by approximately 0.1 microns, the shallow source diffusion 78 is formed from arsenic and phosphorous, and the deep diffusion portion 80 is formed from phosphorous.

A deep diffusion of phosphorous is utilized in the preferred embodiment of the present invention because its fast-diffusion property permits the formation of the requisite overlap portion 62 while also providing a smoother curvature of the deep diffusion portion 80. This smoother curvature greatly increases the breakdown voltage of the source junction. This is particularly important at the source 56 because of the thinness of the gate dielectric 60 and the high voltages that the source sees during the erasing operations of the present invention.

In accordance with the method of the present invention the preferred embodiment of the cell of the present invention is compatible with CMOS processing. The starting material is p-type having a 100 orientation and a resistivity of 36 to 63 ohmscentimeter. This represents the p-substrate 52 in FIG. 3b. P 31 material is implanted in the N-wells at 90 KeV with a density of $4.0\times10^{12}/cm^2$. The implant is driven into the wells by way of a wet oxidation for 45 minutes at 950 degrees centigrade, followed by a nitrogen, $N_2$, drive at 1150 degrees centigrade.

Thereafter a pad oxide of 500 angstroms thickness is formed at 1000 degrees centigrade in an $O_2$ atmosphere. Silicon nitride is thereafter deposited. The active area is then defined and a screen oxidation of 150 angstroms thickness is formed. The field area is then defined and the field is implanted with $BF_2$ at 50 KeV and a dose of $4\times10^{13}/cm^2$.

Field oxide is then formed at 1000 degrees centigrade for 40 minutes in an atmosphere of $O_2$, followed by 85 minutes at 920 degrees C. in an atmosphere of N$_2$. Followed by six hours at 920° C. in H$_2$/O$_2$ to obtain a thickness of 6500 angstroms. The cell area is then defined and thereafter implanted with boron $^{11}$ at 40 KeV and dose 5×10$^{12}$/cm$^2$. The preceding fabrication processes are conventional.

Up to this point the drain and source areas have been defined, although not yet formed, and the channel portion has also been defined to thereby identify the active area of the cell. In the next step a cell oxide layer between 100 angstroms and 200 angstroms thick is grown at 850 degrees centigrade. This cell oxide layer represents the gate dielectric 60. In order to provide a layer which is relatively free from trapping effects, the oxide is grown in a dry oxygen atmosphere. Thereafter thermal nitridation is performed on the oxide layer for 10 minutes at 1050 degrees centigrade in an atmosphere of ammonia (NH$_3$) and argon (Ar). The high temperature, i.e., 1050 degrees centigrade, removes water, H$_2$O, from the layer, while the ammonia/argon atmosphere anneals any OH radicals from the material. The result is a relatively trap-free layer of oxynitride.

In the next step the floating gate 64 is deposited over the gate dielectric 60. This involves in situ doping of polysilicon when the polysilicon is deposited as the floating gate. To do this, SiH$_4$ and PH$_3$ are combined by way of chemical vapor deposition to form Si (phosphorous-doped). By in situ doping of the polysilicon material additional high temperature fabrication steps can be avoided. This is important in order to minimize the grain size in the polysilicon. It has been found that with a smaller grain size of polysilicon, a smoother polysilicon surface is obtained thus permitting reliable thinner layers of oxide to be grown on the polysilicon surface.

The next step involves the forming of the dielectric layer 66 between the control gate 68 and the floating gate 64. In the preferred embodiment of the present invention this dielectric layer comprises a thin layer of thermal oxide and a relatively thick layer of tantalum pentoxide. The thermal oxide layer is grown first at a temperature of 1040 degrees centigrade. This is followed by the step of sputtering ultra pure tantalum using an argon/oxygen sputtering gas. In the preferred embodiment of the present invention the argon to oxygen ratio is approximately 4:1. Preferably the oxygen content of the sputtering gas is at least 25%. Also, it is preferred that the resulting tantalum pentoxide deposition Ta$_2$O$_5$ is slightly oxide rich so that the composition is approximately Ta$_2$O$_{5.25}$ to Ta$_2$O$_{5.5}$. As a result of this 2 5. tantalum pentoxide/silicon dioxide sandwich, leakage current between the control gate 68 and floating gate 64 is reduced, and the coupling ratio enhanced. The amount of voltage between the floating gate and substrate during an erase or program operation, is thus increased.

Thereafter, the tantalum pentoxide, thermal oxide, and polysilicon layers 20, are subjected to an etch to define the floating gate 64 in the direction shown in FIG. 3c.

In the typical fabrication process of the cells of the present invention peripheral circuitry, such as sense transistors, address decoding circuitry and the like, are also provided on the same chip. Thus, where such other peripheral devices are present, the next step is to form these devices. It is to be understood, however, that where peripheral devices are not present the next step in the fabrication process would be the deposition of the control gate layer.

Under the former circumstances, where peripheral devices are being formed on the same chip, the gate dielectric for these peripheral devices are formed to a thickness of approximately 300 angstroms and at a temperature of approximately 1000 degrees C. Thereafter a two-step boron implant is performed on the oxide layer. This creates a slightly deeper concentration of boron to reduce the occurrence of source/drain punch-through problems. The first boron implant is conducted at 50 KeV while the second is conducted at 100 KeV to form a "two-bump" implant profile.

Thereafter, the control gate layer 68 is formed, preferably of polysilicon. This layer represents the conventional control gate for the peripheral devices. This layer is then doped in a conventional manner.

The above steps are then followed by the definition and etching of the control gate areas.

Thereafter, the source and drain areas are masked and implanted with arsenic to a depth of approximately 0.2 to 0.3 micrometers. Then the drain areas are masked off and a high voltage implant is performed with phosphorous into the source areas of the EEPROM cells. It has been found that the fast diffusion characteristics of phosphorous provides the mechanism by which the overlap portion 62 between floating gate 64 and the source 56 can be obtained, as well as the smooth curvature required for high breakdown voltage in the source junction.

The above steps are then followed by implantation of source and drain regions for the p-channel peripheral devices. Thereafter a BPSG deposition is conducted at 390 degrees centigrade and a thickness of 1 micron, followed by a densification of the glass at 900 degrees centigrade for 20 minutes in a steam oxidation atmosphere. Finally, N+plug implants are performed using phosphorous at 50 KeV and a dose of 3×10$^{15}$/cm$^2$, to reduce spiking problems in the contact area.

The above steps are followed by conventional damage removal, metalization, and passivation.

The device structure and method discussed above permits the formation of high density EEPROM memories, for example, of one megabit density. Referring to FIG. 5b, an array of such devices is illustrated which can provide such a density. The memory cell array is enclosed in dotted line 82, while a single cell of the memory array is enclosed in dotted line 84. The peripheral circuitry on the device includes conventional row address decoding circuitry 86, column address decoding circuitry 88, sense amplifier circuitry 90, output buffer circuitry 92, and input buffer circuitry 94. These conventional circuits correspond to the peripheral devices discussed earlier in the fabrication section.

FIG. 5a illustrates a typical prior art EEPROM memory cell, such as enclosed by dotted line 96. Due to the programming and erase voltage requirements for previous EEPROM devices, a select transistor 98 is required in conjunction with the EEPROM transistor 100. The select transistor serves to isolate EEPROM transistors from the other memory cells when a particular memory cell is being operated upon. As such, a typical EEPROM memory cell of previous configurations require two transistors and approximately 165 square microns of surface area.

In contrast, because of the programming and erase requirements for the EEPROM cell of the present invention, a memory cell in accordance with the present invention requires only 25 square microns of area, and no select transistor. Thus, the array structure shown in FIG. 5b can be utilized.

There it can be seen that adjacent transistors are reversed in orientation. Thus, in the upper left-hand corner of the array, cell 84 has its source connected to the source of transistor 102 in the next column. The drain of transistor 84 is connected to the drain of transistor 104 in the same column. The junction of the drains for transistor 104 and for transistor 84 are connected to a line 106 from column address decode circuitry 88. Line 106 is connected to all other drain junctions of the transistors in the column shared by transistors 84 and 104. The gate of transistor 84 is connected to line 108 from row address decode circuitry 86. Line 108 is connected to the gates of all transistors in the same row as transistors 84 and 102.

A common connection for these source lines to each of the memory cells is shown. Due to the interconnect configuration of the array 82 a common source connection can be used yet programming individual cells and erasing of all the cells can be obtained. For example, if cell 84 is desired to be programmed, line 106 from column address decode circuitry 88 is raised to high voltage as is line 108 from row address decode circuitry 86. At the same time common source line 110 is held at a ground potential. Because the drain lines on all of the other cells in the other columns are grounded, and because the gate lines for all of the other cells in the same row, as cell 84, are grounded, the contents of the other memory cells will not be effected.

Similarly, in the event that an erase mode is desired, the common line 110 is raised to the high potential level and the corresponding gate line, 108, is held at a ground potential. As can be seen from FIG. 5b, due to the common connection of the source terminals of the memory cells in each row, all cells in all of the rows will be erased. In the event that smaller segments of the row are desired to be selectively erasable at any one time, isolating transistors can be added at selected intervals among the columns.

A byte erase scheme in the array is achieved by adding an extra select transistor per byte of cells. This is shown in FIG. 5d.

In order to erase Byte 1, the WL2 line is brought high and the source line, e.g. 126, for the corresponding byte is brought high. All the other wordlines are held low. All bit lines (column), e.g. 128, are kept floating. Under these conditions, cells in Byte 1 see a high voltage on the source and low voltage on the gate. This causes the cells to erase to a low $V_t$ condition. Byte 2 is not disturbed because T both gate and source are high and the drain is floating.

In the preferred embodiment of the present invention, in order to ensure that the data in the unselected bytes on WL2 remain undisturbed, all of the unselected source lines are held at an intermediate level, e.g. 5 volts. The asymmetrical structure of the source/drain junction itself and the programming configuration of the present invention provide a measure of protection from inadvertent modification of unselected bytes served by the WL2 line, even without raising the unselected source lines to the intermediate level.

It is believed that the above is true for the following reasons. When the gate is high and the source is at a lower potential, as is the case with the bytes served by WL2, the channel 58 is conductive. Thus, the capacitance seen by the floating gate is equivalent to the capacitance across the entire channel, e.g. capacitors 72, 74 and 76 in FIG. 4. This represents a large capacitive component and hence a very low capacitive coupling ratio, e.g. 0.1 to 0.2. As such, the Fowler-Nordheim tunneling effect will be inoperative and no change in the charge on the floating gate will occur. In contrast, when the source is at a high potential and the gate is grounded, as is the case with the devices in Byte 1, the channel 58 is non conductive. Only the overlap region 62 is conductive. Thus, the floating gate sees a much smaller capacitance, e.g. only capacitor 76 in FIG. 4, and the coupling ratio is accordingly much higher, e.g. 0.8 to 0.9. With a higher coupling ratio, Fowler-Nordheim tunneling will occur.

The capacity to erase a column of bytes can be obtained by modification of the structure in FIG. 5b. To do so, a separate source line can be provided for each column of bytes. Thus, in FIG. 5b this is shown implemented by opening the row address line, or word line, at points 130, and adding separate source lines (dashed lines 132) as indicated. In this configuration, an entire column of bytes can be selected for erasure.

Referring to FIG. 5c the physical geometry of the array structure 82 of FIG. 5b is shown in part. Dotted lines 112 and 114 each indicate a single memory cell. Regions 116, indicated by parallel lines, represent a metalization layer which extends vertically, in the figure, across each of the cells to interconnect the drain junctions of the cells. Regions 118, defined by dotted/dashed lines, define the boundary between the field isolation oxide and the active/diffusion area. Regions 120, defined by a straight line and a periodically varying line, define the control gate layer which extends across the memory cells of a common row. Within a particular memory cell, for example 112, the shaded region 122 represents the layers of the control gate, the second layer of dielectric material 66, the floating gate 64, and the gate dielectric 60. Finally, the drain connection for each memory cell can be seen as represented by rectangles 124. It is to be noted that regions 124 interconnect the drains of adjacent memory cells in each column. In the manner above, a compact, high density EEPROM memory array can be obtained.

Finally, referring to FIGS. 6a and 6b, the experimental results for programming and erasing of the EEPROM cell of the present invention are illustrated. FIG. 6a illustrates the erasing characteristics of the present invention. As can be seen from the figure, the vertical axis represents the threshold voltage for the cell, while the horizontal axis represents the magnitude of the pulse applied to the source terminal of the cell. Thus it can be seen that threshold voltages on the order of 0 to 1 volt can be obtained for pulse amplitudes of approximately 12 volts.

Referring to FIG. 6b, the programming characteristics of the cell are shown. The vertical axis represents the threshold voltage for the cell, while the horizontal axis represents the drain voltage. The curve comprising closely-spaced dots represents a pulse amplitude on the gate of 12 volts, while the curve of widely-spaced dots represents a gate pulse amplitude of 11 volts. Finally, the solid line curve represents a gate pulse amplitude of 10 volts. As can be seen from the figure, drain voltages on the order of 5 to 7 volts will produce threshold levels in excess of 3 volts when a gate pulse between 10 and 12 volts is used.

Clearly, the programming and erase characteristics shown in these figures are far superior to that of presently available EEPROM memory cells.

The terms and expressions which have been employed here are used as terms of description and not of limitations, and there is no intention, in the use of such terms and expressions of excluding equivalence of the features shown and described, or portions thereof, it being recognized that various modifications are possible within the scope of the invention claimed.

We claim:

1. An electrically erasable memory device having a plurality of storage sites, a plurality of row address lines, a plurality of column address lines, and a plurality of erase lines, wherein each combination of one of the plurality of row address lines and one of the plurality of column address lines define a different one of the plurality of storage sites, and further wherein each of the plurality of storage sites comprises a single transistor including
    a source coupled to an associated one of the plurality of erase lines;
    a drain coupled to an associated one of the plurality of column address lines;
    a control gate coupled to an associated one of the plurality of row address lines; and
    a floating gate positioned between the gate and the source and drain; and further including
    means for injecting hot electrons onto the floating gate when the associated ones of the column address and row address lines are raised to a first predetermined potential above that of the associated one of the erase line; and
    means for inducing Fowler-Nordheim tunneling of electrons from the floating gate to the source when the associated erase line is raised to a second predetermined potential above the associated row address line.

2. The device of claim 1 wherein the injecting means comprise
    a first layer of insulating material positioned between the gate and the floating gate, said insulating material having a predetermined thickness and having a high dielectric constant to provide a high capacitance between the gate and floating gate; and
    a secod layer of insulating material positioned between the floating gate and the source and drain, said second layer having a thickness less than the thickness of the first layer of insulating material and which is selected so as to permit Fowler-Nordheim tunneling while optimizing the capacitive coupling between the floating gate and the source.

3. The device of claim 2 wherein the dielectric constant of the first layer is greater than 5.

4. The device of claim 3 wherein the thickness of the second layer is less than 200 angstroms.

5. The device of claim 4 wherein the second layer comprises oxynitride.

6. The device of claim 3 wherein the first layer includes tantalum pentoxide.

7. The device of claim 3 wherein the first layer includes oxide rich tantalum pentoxide.

8. The device of claim 3 wherein the first layer comprises a sandwich including a layer of tantalum pentoxide and a layer of thermal oxide.

9. The device of claim 8 wherein the tantalum pentoxide layer is approximately 500 angstroms thick.

10. The device of claim 8 wherein the thermal oxide layer is approximately 150 angstroms thick.

11. The device of claim 2 wherein the tunneling means include
    a source diffusion having a portion which underlies the floating gate so as to accept electrons which have tunneled through the second layer from the floating gate, said source diffusion having a smooth curvature so that gate-aided junction breakdown voltages are increased.

12. The device of claim 11 wherein the source diffusion comprises
    a diffusion of arsenic having a predetermined depth; and
    a diffusion of phosphorus having a depth which is greater than the depth of the diffusion or arsenic.

13. The device of claim 2 wherein the first layer of insulating material comprises a sandwich of tantalum pentoxide and thermal oxide, the second layer of material comprises oxynitride, and the control gate and floating gate each comprise polysilicon.

14. The device of claim 1 wherein the plurality of storage sites are arranged in an array to form rows and columns of storage sites, and further wherein the erase line associated with each of the plurality of storage sites are connected in common; the column address line for each of the storage sites in a column are connected in common; and the row address line for each of the storage sites in a row are connected in common.

15. The device of claim 14 wherein the transistors in the storage sites in each of the columns are positioned so that the source of any one transistor in a column is coupled to the source of an adjacent transistor in the same column and the drain of the one transistor is coupled to the drain of a different adjacent transistor in the same column.

16. The device of claim 1 wherein the plurality of storage sites are arranged in an array to form rows and columns of sites, in which the column address lines for each of the storage sites in a column of sites are connected in common, and the row address line for each of the storage sites in a row are connected in common, and the storge sies of each row are arranged in bytes; and further wherein the bytes of storage sites are arranged in columns of bytes; and the erase lines associated with each of the storage sites in a particular column of bytes are connected in common; so that a column of bytes can be erased at one time.

17. The device of claim 1 wherein the plurality of storage sites are arranged in an array to form rows and columns of sites, in which the storage sites of each row are arranged in bytes, the row address lines for each of the storage sites in a row are connected in common, and the column address lines for each of the storage sites in a column of sites are connected in common; and further wherein the bytes of storage sites are arranged in columns of bytes and a different one of a plurality of column select lines is associated with each column of bytes; further including
    a plurality of means, each associated with a particular byte and coupled to the row address line that is associated with the particular byte, for selecting the particular byte;
    wherein each selecting means is responsive to the column select line associated with the column in which the particular byte resides, and further wherein each selecting means is coupled to the erase lines for the storage sites in the byte with which said selecting means is associated and also coupled to the erase lines of the storage sites in an adjacent byte within the same column; so that a single byte can be erased at one time by raising the column select line for the column in which the byte to be erased resides to a first potential, floating all column address lines associated with said column, and raising the row address line for the associated adjacent byte within said column to a second potential less than said first potential.

* * * * *